(12) United States Patent
Ong et al.

(10) Patent No.: US 9,653,151 B1
(45) Date of Patent: May 16, 2017

(54) MEMORY ARRAY HAVING SEGMENTED ROW ADDRESSED PAGE REGISTERS

(71) Applicant: Kilopass Technology, Inc., San Jose, CA (US)

(72) Inventors: Adrian E. Ong, Pleasanton, CA (US); Bruce Bateman, Fremont, CA (US)

(73) Assignee: Kilopass Technology, Inc., San Jose, CA (US)

( * ) Notice: Subject to any disclaimer, the term of this patent is extended or adjusted under 35 U.S.C. 154(b) by 0 days.

(21) Appl. No.: 15/288,914

(22) Filed: Oct. 7, 2016

(51) Int. Cl.
| | |
|---|---|
| *G11C 11/00* | (2006.01) |
| *G11C 11/419* | (2006.01) |
| *G11C 11/418* | (2006.01) |
| *H01L 27/102* | (2006.01) |
| *G11C 11/39* | (2006.01) |

(52) U.S. Cl.
CPC .......... *G11C 11/419* (2013.01); *G11C 11/39* (2013.01); *G11C 11/418* (2013.01); *H01L 27/1027* (2013.01)

(58) Field of Classification Search
CPC ..... G11C 11/419; G11C 11/418; G11C 11/39; H01L 27/1027
See application file for complete search history.

(56) References Cited

U.S. PATENT DOCUMENTS

| | | | |
|---|---|---|---|
| 2013/0229855 A1* | 9/2013 | Kwak | G11C 13/0023 365/148 |
| 2014/0025866 A1* | 1/2014 | Kim | G06F 12/0246 711/103 |
| 2016/0329094 A1* | 11/2016 | Luan | H01L 21/8249 |

* cited by examiner

*Primary Examiner* — Toan Le
(74) *Attorney, Agent, or Firm* — Ropes & Gray LLP

(57) ABSTRACT

The access speeds of new memory technologies may not be compatible with product specifications of existing memory technologies such as DRAM, SRAM, and FLASH technologies. Their electrical parameters and behaviors are different such that they cannot meet existing memory core specifications without new architectures and designs to overcome their limitations. New memories such as STT-MRAM, Resistive-RAM, Phase-Change RAM, and a new class of memory called Vertical Layer Thyristor (VLT) RAM requires new read sensing and write circuits incorporating new voltage or current levels and timing controls to make these memory technologies work in today's systems. Systems and methods are provided for rendering the memory cores of these technologies transparent to existing peripheral logic so that they can be easily integrated.

19 Claims, 5 Drawing Sheets

MEMORY ARRAY HAVING SEGMENTED ROW ADDRESSED PAGE REGISTERS

FIELD OF THE DISCLOSURE

The present disclosure relates generally to Random-Access Memory (RAM) and FLASH memory technologies, and more particularly to memory storage with slow memory access times.

BACKGROUND OF THE DISCLOSURE

Access speeds for new memory technologies such as Spin Transfer Torque-Magnetoresistive Random-Access Memory (STT-MRAM), Resistive-RAM, Phase-Change RAM, and Vertical Layer Thyristor (VLT) RAM may not be compatible with product specifications of existing memory technologies such as Dynamic Random Access Memory (DRAM), Static Random Access Memory (SRAM) and FLASH technologies. Additional circuitry and controls are needed to integrate these new memory technologies with existing peripheral logic.

SUMMARY OF THE DISCLOSURE

System and methods and are provided for interfacing with cross-point memory arrays in order to mitigate effects of slow access times associated with memory cells of the array. A read operation may be divided nominally into a row access operation with an associated row access time, and a column access operation with an associated column access time. In some embodiments of the present disclosure, part of the column access operation is performed during the row access operation. For example, data from columns may be pre-fetched during the nominal row access operation and stored in memory devices having shorter access times than the memory cells of the cross-point memory array (e.g., the memory device is faster than the memory cells of the cross-point memory array). During a subsequent nominal column access operation, pre-fetched data is read from the memory device instead of directly from the cross-point memory array. Accordingly, the slow access times associated with accessing memory cells of the cross-point memory array are masked by the shorter (e.g., faster) access time of the memory device during the column access operation.

In some embodiments, a memory block may include a memory array tile, a decoder, a multiplexor, and/or at least one memory device. The memory array tile may include a cross-point memory array having a plurality of word-lines, a plurality of bit-lines, and a plurality of memory cells at one or more intersections of the plurality of word-lines and the plurality of bit-lines. The memory cells of the memory array tile may be accessed by a memory address that may be sub-divided into a row address and a column address. A first portion of the row address may be used to select a subset (e.g., one or more) of the plurality of word-lines using the decoder. A second portion of the row address may be used to select a subset of the plurality of bit-lines using the multiplexor. The column address may be used to access the at least one memory device coupled to an output of the multiplexor (e.g., the subset of the plurality of bit-lines). The decoder may include a first plurality of inputs corresponding to the first portion of a row address, and a first plurality of outputs coupled to at least a portion of the plurality of word-lines. The multiplexor may include a second plurality of inputs corresponding to the second portion of the row address, a third plurality of inputs coupled to at least a portion of the plurality of bit-lines, and at least one multiplexor output (e.g., one or more selected bit-lines from the first plurality of inputs). The at least one memory device may be coupled to the at least one multiplexor output, and the at least one memory device may include a memory device input based on at least a portion of a column address. A read access time of the at least one memory device may be shorter than a read access time of a memory cell of the cross-point memory array (e.g., of the memory array tile).

In some aspects, the at least one memory device of the memory block, which is coupled to the at least one output of the multiplexor, may be an SRAM register, DRAM, or other suitable rewriteable memory. In some aspects, the memory array tile includes or may be sub-divided into a plurality of bit-line segments. A first bit-line segment of the plurality of bit-line segments may include the at least a portion of the plurality of bit-lines (e.g., of the cross-point memory array), the multiplexor including the second plurality of inputs corresponding to the second portion of the row address, the second plurality of outputs coupled to the at least a portion of the plurality of bit-lines and the at least one multiplexor output, and the at least one memory device coupled to the at least one multiplexor output, where the at least one memory device includes a memory device input based on the portion of the column address. Each of the plurality of bit-line segments may be coupled to another adjacent or non-adjacent bit-line segment (e.g., in a row of bit-line segments), by the plurality of word-lines (e.g., of the cross-point memory array). Each of the plurality of bit-line segments may include a respective subset of the plurality of bit-lines (e.g., of the cross-point memory array), a respective multiplexor, and at least one respective memory device coupled to a respective multiplexor output. The respective multiplexor may include the second plurality of inputs corresponding to the second portion of the row address, a second plurality of inputs coupled to the at least a portion of the plurality of bit-lines (e.g., of the cross-point memory array), and at least one respective multiplexor output.

In some aspects, there may be one decoder of the memory block that is coupled to word-lines of all of the bit-line segments of the memory block. In some aspects, each bit-line segment may have a separate respective decoder coupled to respective portions of word-lines of a respective bit-line segment. In some aspects, each respective multiplexor of each bit-line segment multiplexes at least 8 inputs to an output. In some aspects, each respective multiplexor may multiplex a multiple of at least 4 inputs to at least one or more outputs. In some aspects, a percentage of a total area of the memory block that is occupied by the plurality of memory cells (e.g., of the cross-point memory array) exceeds 70%. As referred to herein, a memory cell may be understood to refer to an area occupied by a functional unit of memory within a memory array. Examples of a memory cell include a DRAM cell, a thyristor cell, an RRAM cell, or any other suitable unit of memory. The total area of a memory block may include area occupied by memory cells and additional devices such as driver circuitry, sense amplifier circuitry, decoder circuitry, controller circuitry (e.g., for implementing a finite state machine), power circuitry, and other circuitry. In some aspects, each of the plurality of memory cells (e.g., of the cross-point memory array) is a thyristor memory cell.

In some embodiments, a memory block may include a memory array tile, a decoder, a multiplexor, and/or at least one memory device. The memory array tile may include a cross-point memory array having a plurality of word-lines, a plurality of bit-lines, and a plurality of memory cells at one or more intersections of the plurality of word-lines and the plurality of bit-lines. The memory cells of the memory array tile may be accessed by a memory address that may be sub-divided into a row address and a column address. A first portion of the row address may be used to select a subset (e.g., one or more) of the plurality of word-lines using the decoder. A second portion of the row address may be used to select a subset of the plurality of bit-lines using the multiplexor. The column address may be used to access the at least one memory device coupled to an output of the multiplexor (e.g., the subset of the plurality of bit-lines). The decoder may be configured to receive a first portion of a row address and select a word-line of the plurality of word-lines based on receiving the first portion of the row address. The multiplexor may be configured to receive a second portion of the row address and select at least one bit-line of the plurality of bit-lines as at least one multiplexor output. The at least one memory device may be coupled to the at least one multiplexor output, and the at least one memory device may be configured to receive an input based on a portion of a column address.

In some aspects, the at least one memory device of the memory block, which is coupled to the at least one output of the multiplexor, may be a register, a SRAM register, DRAM, or other suitable rewriteable memory. In some aspects, the memory array tile includes or may be sub-divided into a plurality of bit-line segments. A first bit-line segment of the plurality of bit-line segments may include the at least a portion of the plurality of bit-lines (e.g., of the cross-point memory array), the multiplexor configured to receive the second portion of the row address, and the at least one memory device coupled to the at least one output of the multiplexor. Each of the plurality of bit-line segments may be coupled to another adjacent or non-adjacent bit-line segment (e.g., in a row of bit-line segments), by the plurality of word-lines (e.g., of the cross-point memory array). Each of the plurality of bit-line segments may include a respective subset of the plurality of bit-lines (e.g., of the cross-point memory array), a respective multiplexor, and at least one respective memory device coupled to the at least one respective multiplexor output. The respective multiplexor may be configured to receive the second portion of the row address and select at least one bit-line of the respective subset of the plurality of bit-lines as at least one respective multiplexor output. The at least one respective memory device may be configured to receive the input based on a portion of the column address.

In some aspects, there may be one decoder of the memory block that is coupled to word-lines of all of the bit-line segments of the memory block. In some aspects, each bit-line segment may have a separate respective decoder coupled to respective portions of word-lines of a respective bit-line segment. In some aspects, each respective multiplexor of each bit-line segment multiplexes at least 8 inputs to an output. In some aspects, each respective multiplexor may multiplex a multiple of at least 4 inputs to at least one or more outputs. In some aspects, a percentage of a total area of the memory block that is occupied by the plurality of memory cells (e.g., of the cross-point memory array) exceeds 70%. In some aspects, each of the plurality of memory cells (e.g., of the cross-point memory array) is a thyristor memory cell.

In some embodiments, a memory bank may include a plurality of memory blocks, a select device (e.g., a BL-RW Select [BS] device), and a memory device. The plurality of memory blocks may be divided into a plurality of rows of memory blocks and a plurality of columns of memory blocks (e.g., in a grid of memory blocks). Each respective column (e.g., of the plurality of columns of memory blocks) may include a respective plurality of first input lines that is coupled to each memory block of the respective column, and a respective plurality of first output lines that is coupled to each memory block of the respective column. The select device may be coupled to each column of memory blocks by a respective second plurality of input lines corresponding to a respective column (e.g., used to select one or more memory blocks of the respective column). The select device may be configured to receive a first input based on at least a portion of a row address and configured to generate signals, based on receiving the first input (e.g., based on the at least a portion of the row address) for accessing at least one memory block of the plurality of memory blocks. The memory device may be coupled to each column of memory blocks by a respective plurality of output lines corresponding to a respective column. The memory device may be configured to receive a second input based on at least a portion of a column address, and may be configured to store data from the accessed at least one memory block, based on receiving the second input. A read access time of the memory device may be shorter than a read access time of a memory cell of the cross-point memory array In some aspects, the memory device may be an SRAM memory device (e.g., an SRAM page register), a DRAM memory device, or other suitable memory device. In some aspects, each memory block of the plurality of memory blocks may include a memory array tile, a decoder, and a multiplexor. The memory array tile may include a cross-point memory array having a plurality of word-lines, a plurality of bit-lines, and a plurality of memory cells at one or more intersections of the plurality of word-lines and the plurality of bit-lines. The decoder may include a third plurality of inputs corresponding to a first portion of the row address, and a third plurality of outputs coupled to at least a portion of the plurality of word-lines. The multiplexor may include a fourth plurality of inputs corresponding to a second portion of the row address, and a fifth plurality of inputs coupled to at least a portion of the plurality of bit-lines, and at least one multiplexor output. In some aspects, each memory block of the plurality of memory blocks does not include an SRAM memory device (e.g., an SRAM register or SRAM page register). In these aspects, there may be one memory device (e.g., the SRAM page register) for each of the memory blocks of the memory bank to share. In some aspects, each of the plurality of memory cells (e.g., of the cross-point memory array of each memory block) is a thyristor memory cell. In some aspects, a percentage of total area of each memory block that is occupied by a respective plurality of memory cells exceeds 70%.

BRIEF DESCRIPTION OF THE DRAWINGS

Further features of the disclosure, its nature and various advantages will be apparent upon consideration of the following detailed description, taken in conjunction with the accompanying drawings, in which like reference characters refer to like parts throughout, and in which.

DETAILED DESCRIPTION OF THE DRAWINGS

Figure 1:
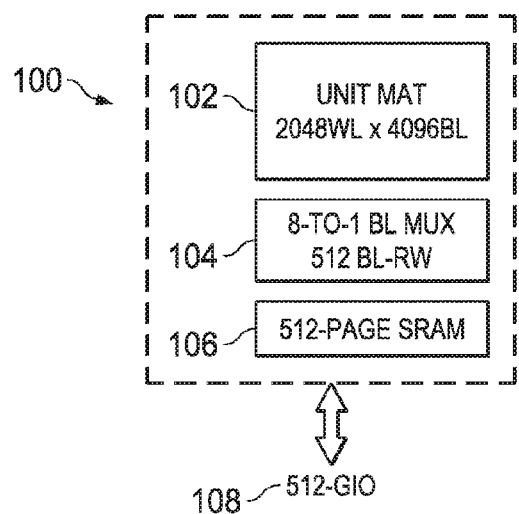
FIG. 1 depicts a block diagram of a unit Memory Array Tile (MAT) with Bit-line Read/Write (BL-RW) and SRAM Page Register, according to an illustrative implementation.

Memory speeds are getting faster with every generation. The most advanced low voltage swing double data rate memories can transfer data as fast as 4.2 G bits per second per pin. The internal clock frequency, in this case, is 2,133 Mhz, or a clock period of 0.46875 ns. Recent advancements in new memory technologies have properties that potentially allow a cross-point architecture design; (for example, memory bits in a cross-point array can be uniquely selected without the use of one or more select transistors per memory cell, as required for DRAM or SRAM devices). Among them are Conductive-Bridging RAM (CBRAM), Memristor RAM, and Vertical Layer Thyristor RAM (VLT-RAM).

The VLT memory cell includes of a vertical pnpn layer thyristor with two tungsten gate p-PMOS write assist side wall transistors. Advantages of thyristors include the ability to precisely tune operating characteristics (e.g., switching speed, static power consumption, dynamic power consumption, etc.) by tuning the geometry and composition of component layers of each thyristor cell. VLTs may be arranged as an array of minimum $4F^2$ cells, thereby minimizing cell area and reducing fabrication cost. VLTs may also be arranged in a stacked configuration to further increase the density of memory cells in a cross-point array.

The VLT memory cells can be uniquely accessed without one or more select transistors. They can be selected in a cross-point architecture by toggling the Bit-lines (BLs) and Word-lines (WLs) appropriately for read and write operations. A cross-point architecture may be implemented as a cross-point array of memory cells. The maximum size of a cross-point architecture (e.g., as determined by a number rows corresponding to a number of WLs and a number of columns corresponding to a number of BLs) is limited by an amount of resistive drop across WL segments and BL segments leading to and from a VLT cell in a cross-point array. The resistive drops reduce the read margin of an accessed VLT. Accordingly, a first current margin that can be sensed from a first VLT in a center of a cross-point architecture may be lower than a current margin that can be sensed from a second VLT located near an outer portion of the cross-point architecture. The resistive drops from WL segments and BL segments may be reduced by lowering the resistance of a corresponding WL or corresponding BL. Techniques for lowering the resistance of a WL or BL include fabricating the WL or BL from a material (e.g., metal such as copper, tungsten, titanium, a Group 11 metal, a Group 6 metal, a Group 4 metal, a Group 9 metal, other transition metal, metal silicide formed from any of the aforementioned metals, doped metal oxide formed from any of the aforementioned metals, heavily doped silicon, or any combination thereof) having a higher conductivity.

VLT-RAM has a number of advantages over DRAM devices. Its smaller cell size and high memory efficiency design allows for more than 10% die size reduction for the same process technology node. A major advantage it has over DRAM is that it does not require refresh. This is important to its improved system performance and lower power consumption. However, a challenge of the VLT cross-point memory is that it lags key DRAM configurations and operating timing specifications.

In order to utilize VLT-RAM as a DRAM replacement, its challenge may be compensated and/or overcome by using the embodiments disclosed herein. In some embodiments, a segmented row addressed multiple-to-one BL MUX may be coupled to a first layer BL-RW circuitry, which may be coupled with a second layer register or SRAM latch. As referred to herein, the term "coupled to" may be understood to refer to directly or indirectly connected (e.g., through an electrical connection). This structure allows the VLT memory to seamlessly interface to DRAM memory peripheral circuits or other memory peripheral circuits and allows the VLT memory to be compatible to existing system memory controllers. The advantages of this approach are not limited to just meeting the various industry standards, but fundamentally hide the slow memory access times and improve the overall memory device performance.

FIG. 1 depicts a block diagram of a unit MAT with BL-RW and SRAM Page Register, according to an illustrative implementation. Memory block 100 is composed of a unit MAT 102, which is shown in FIG. 1 as a 2048 Word-line (2048-WL) by 4096-BL memory array. The array dimension of the unit MAT 102 may be changed or re-optimized based on process technology or product design specifications. In some embodiments, the unit MAT may include a cross-point array of memory cells. In some embodiments, the unit MAT may include the cross-point array of memory cells and additional circuitry such as sub-WL driver circuitry, BL sense amplifier circuitry, and other circuitry interspersed within a cross-point array of memory cells. In some embodiments, the unit MAT 102 may be further sub-divided into smaller memory array tiles (not shown). When further sub-divided into the smaller memory array tiles, the unit MAT may include circuitry interspersed between the smaller memory array tiles. For example, the unit MAT 102 may include bit-line multiplexor ("BL-MUX") circuitry and precharger circuitry. For example, the MAT 102 may include BL sense amplifier (BLSA) circuitry and page buffer circuitry. For example, the BL-MUX circuitry, precharger circuitry, BLSA circuitry and page buffer circuitry may be placed between the smaller memory array tiles of a subdivided unit MAT (not shown). The 4096 BL of unit MAT 102 are fed to an 8-to-1 BL MUX, such that the 4096 BLs are converted to 512 BL-RW at MUX block 104. The BL-RW may be a circuit which includes BL sensing circuitry (i.e. sense amplifier circuitry) and driver circuitry (e.g., a data-in write driver circuit). Each of the 512 BL-RW has an associated SRAM Page Register, as shown at SRAM Page Register block 106. Block 106 may also be a DRAM Register, or any other register. The output of the memory block 100 is 512 General-Purpose I/O (GIO) lines shown at 108. The 512 page SRAM may be addressed by a 9 bit address. In some examples, 6 of the 9 bits may be used to decode 1 of 64 possible column select (CS) lines. In some examples, each CS line selects 8 bits, such that 64 total CS lines may access 512 bits. In some examples, the remaining bits may be used for a Double Data Rate (DDR) start burst address.

Changing any one of the BL dimensions, e.g. of the unit MAT 102 or the ratio of the BL MUX in MUX block 104, may change the total number of BL-RW in MUX block 104, number of SRAMs in SRAM block 106 or number of output GIO lines at 108. For example, with 4096 BL in Unit MAT 102, a 4-to-1 BL MUX would result in 1024 BL-RW, SRAM Page Registers and GIO outputs at 104, 106 and 108, respectively. Any of these dimensions may be changed to adjust for product design specifications or process technology. In some embodiments, the Unit MAT size may be modified to increase the number of WL (e.g., up to or greater than 2048 WL), when a higher conductivity material is used to fabricate the BL, and thereby reduce the resistance of the BL. In some embodiments, the Unit MAT size may be modified to increase the number of BL (e.g., up to or greater than 4096 BL), when a higher conductivity material is used to fabricate the WL. When the number of BL in the Unit MAT is increased, the order of the MUX in 104 may be increased to a 16-1 to MUX, and/or the number of BL-RW may be increased from 512 BL-RW to 1024 BL-RW and the size of 512-page SRAM may be increased from 512-page to 1024-page. In some embodiments, the area consumed by the SRAM page in block 106 may be reduced in exchange for a slightly larger MUX in block 104, and longer access time. Because the area consumed by the SRAM block is reduced, the amount of VLT memory cells in the Unit MAT may be increased. In order to reduce the size of the SRAM page (e.g., to 256-page) in block 106, a smaller number of BL-RW and a higher order MUX (e.g., 16-to-1 BL MUX) may be used. The reduction in the SRAM page size reduces the area occupied by the SRAM, while increasing the area of the MUX, and increases the access time of the MUX.

Figure 2:
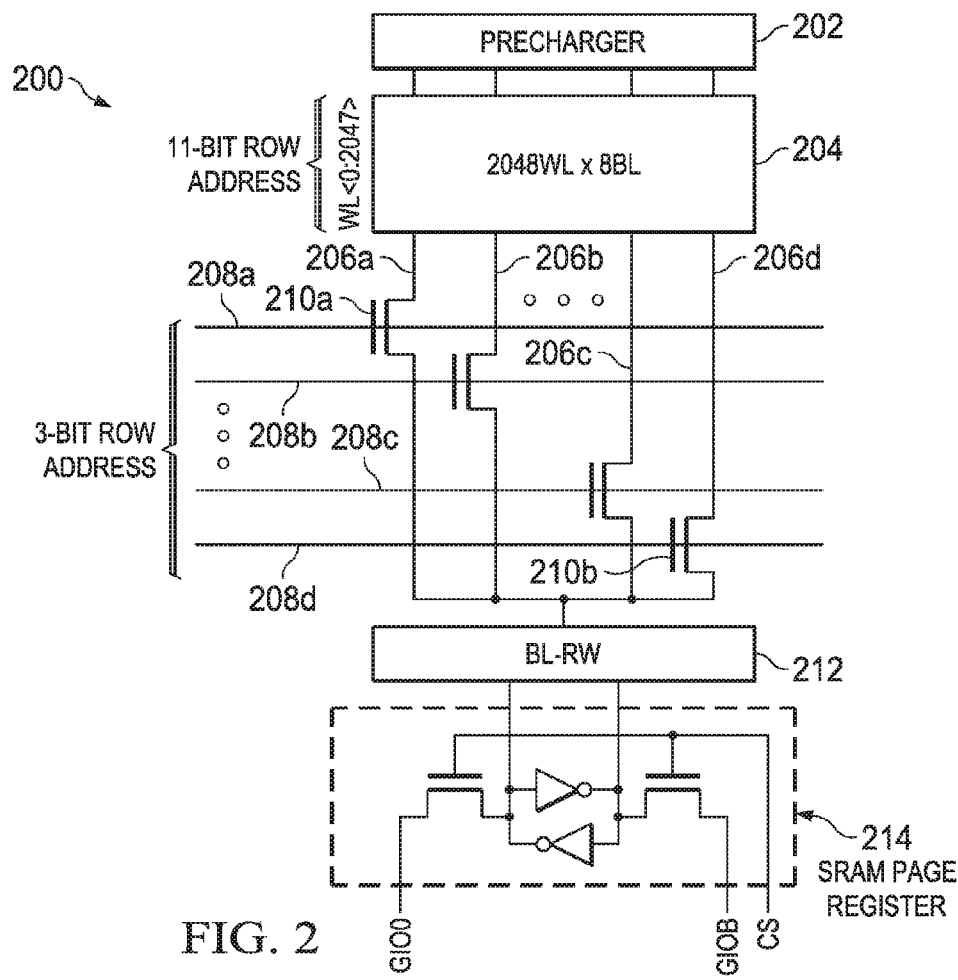
FIG. 2 depicts an 8-1 BL multiplexer (MUX) with SRAM Page Register, according to an illustrative implementation.

FIG. 2 depicts a bit-line segment (BLSEG) that includes an 8-1 BL MUX and SRAM page register 214, according to an illustrative implementation. The bit-line segment 200 includes Precharger 202, a 2048-WL by 8-BL memory array 204, and BL columns 206a, 206b, 206c and 206d (collectively 206) each corresponding to the 8-BL of the memory array 204. The bit-line segment also includes an SRAM page register 214, and a BL-RW 212. In some embodiments, a memory device (e.g., a DRAM, universal memory, MRAM or other memory device) may be used in addition to or in replacement of SRAM page register 214. Page register 214 may also be a DRAM register, or any other register. In some embodiments, Mux Select Lines (MSLs) 208a, 208b, 208c and 208d (collectively 208), BL columns 206, and transistors (e.g., 210a and 210b), and a decoder (not shown, e.g., a 3-bit input to 8 line output decoder) may constitute a multiplexor (e.g., an 8-1 BL MUX, or other order of MUX). In some embodiments, the number of MSLs 208 may be the same number as the number of BL columns 206. Transistors, such as transistors 210a and 210b, may be located along the diagonal of the BL column 206 and MSL 208 array such that each MSL 208 is coupled via a transistor to each of the BL columns 206. WL decoding and driver circuitry (not shown) may be any standard decoder and driver circuitry. For example, a decoder that takes as input a first portion of a row address (e.g., 11 bits of a row address) may select among WLs (e.g., from among 2048 WLs of the memory array 204). Sensing and write circuitry (not shown) may be laid out within the 8-BL pitch formed by the BL columns 206 and MSL 208. This is a major advantage as it allows the layout of the pitch cells (BL sense amplifiers, write drivers, etc.) to be relaxed as well as to occupy less space.

In some embodiments, three row address bits are used to select one of the MSL 208, and, accordingly, one of the BL columns 206. Since each of the MSL 208 are coupled via a transistor (e.g., any of transistors 210a, 210b) to each of the BL columns 206, selecting a MSL 208 also selects a BL column 206. A selected BL column 206 is stored in SRAM Page Register 214. Thus, taking advantage of the DRAM address multiplexing scheme shown in the bit-line segment 200 allows BLs to be selected during a Row access time of a memory access cycle (e.g., DRAM access cycle). This is significant since the memory cell can be addressed ahead of the Column access time. The data in the selected memory bits can be read and stored in the SRAM during a DRAM Bank Activation time, meaning that a slower Row time may be compensated for by the faster SRAM Page Register read time (e.g., during column access time of the DRAM access cycle), allowing both MSLs 208 and columns 206 to be read within standard operating times. The row-to-column address delay is typically 15 ns to 18 ns, providing adequate time for BL sensing of the memory.

The Precharger 202 may precharge all BLs 206, meaning that all BLs, such as BLs 206a, 206b, 206c, 206d, may be precharged before the selection from MSLs 208. The Precharger 202 may also precharge the transistor corresponding to the selected MSL 208, meaning that the 3-bit row address may also be provided to the Precharger to precharge one or more BLs 206a, 206b, 206c, 206d before the selected BL is stored in the SRAM Page Register 214. In some embodiments, the Precharger 202 may be located above the 2048-WL by 8-BL memory array 204, as shown in FIG. 2. In some embodiments, the Precharger 202 may be located below the 2048-WL by 8-BL memory array 204, such that it is located between the 2048-WL by 8-BL memory array 204 and the MSL 208. In some embodiments, the Precharger 202 may also include BL unselect driver circuitry to drive unselected BLs to a different voltage level than the selected BL. The precharging of all BLs 206 may be simpler in implementation but require more power and more time to pre-charge all BLs, while the precharging of a subset of BLs 206 may require an additional decoder but less power and less time.

The column and memory array IO selection can be configured to accommodate a wide variety of data IO configuration and burst lengths. Today's high speed memory can operate at clock speeds over 2.1 Ghz. In a standard double data rate interface, this gives 4.2 Gbps per pin. In order to achieve such high data rates, multiple bits may be pre-fetched in advanced to allow the on-chip serializer to output the data at the desired rate. In today's advanced memories, burst lengths of 16 bits or 32 bits are common. This means at least a 16-bit pre-fetch scheme is necessary. In a 16-n pre-fetch architecture, N 16-bit pre-fetches are needed to support an N 16-bit burst. For example, a burst operation may be understood to refer to a pre-fetch of data (e.g., 512-bits) which is sequentially accessed in smaller segments (e.g., of 16 bits, 32 bits, 64 bits, or any other suitable burst length). In some embodiments, the size of the pre-fetch data may correspond to a size of a page register (e.g., 106 in FIG. 1, 610 in FIG. 6 or another page register external to a memory block, or a memory bank). In some embodiments, the size of the pre-fetch data may be greater than or less than the size of a page register (e.g., 106 in FIG. 1, 610 in FIG. 6 or another page register external to a memory block, or a memory bank).

For example, a burst read operation may prefetch bits required for a burst read cycle. In a burst read operation where a device (e.g., a memory chip that is component on a printed circuit board (PCB) has 16 DQs (e.g., IO pins), and a burst length is set to 16, then 16×16 bits (256 bits) are pre-fetched within the memory chip (e.g., from one or more memory blocks). For example, in a burst write operation, a sequence of group of bits (e.g., where a size of the group corresponds to a number of DQ pins on a device) may be transferred into a page register. The bits may then be written from the page register into the cross-point memory array. For example, in a 16-n prefetch architecture (as described above), a burst read operation or a burst write operation may correspond to multiple pre-fetch operations, instead of a single pre-fetch operation. Some memory configuration specifies a 16 kb (16,384 bits) page size. This means that 16 k bits are available to read or write in the high data rate described above once a page (or bank) is opened (or activated).

Figure 3:
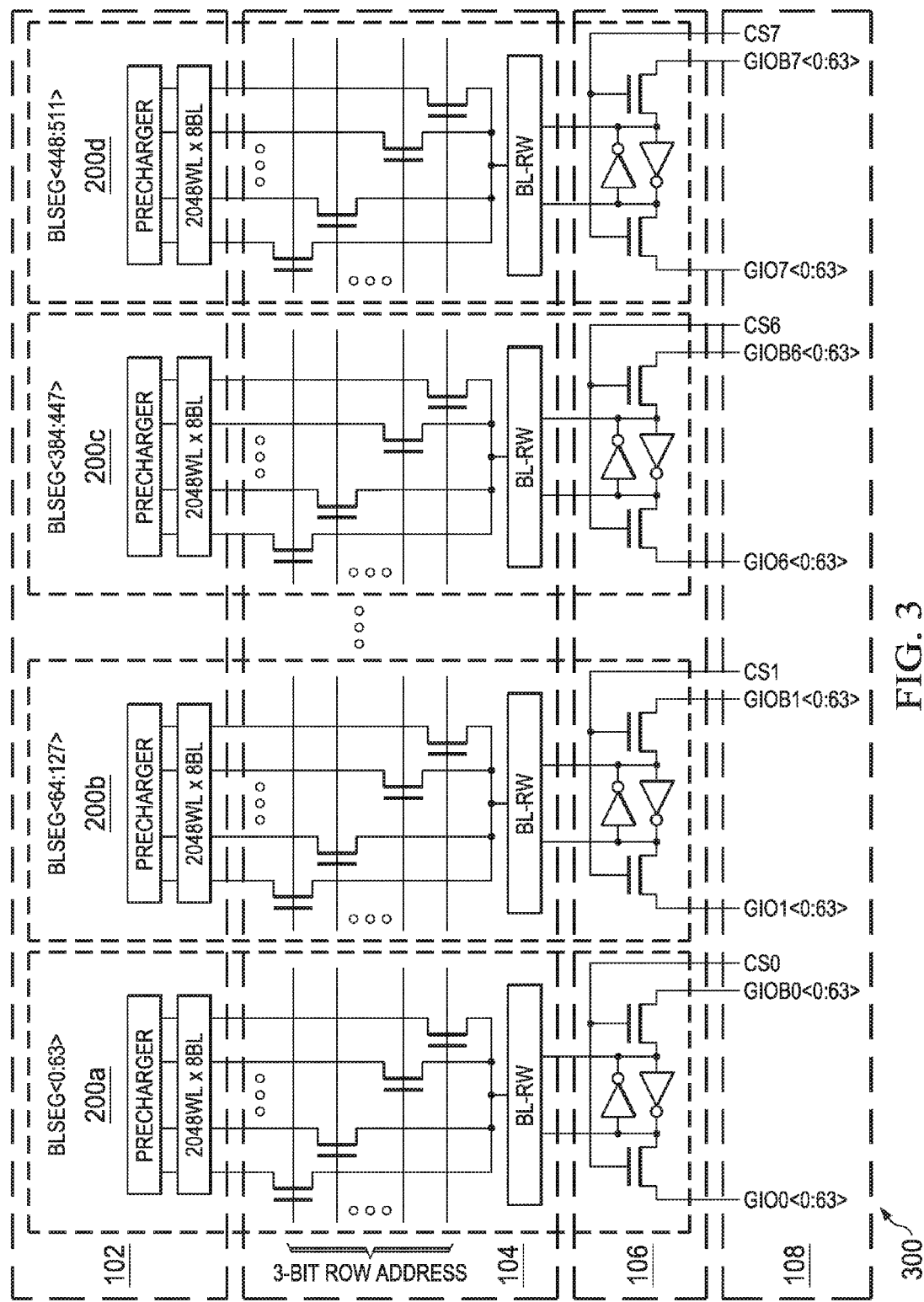
FIG. 3 depicts a single 2048×4096 or 8 Mb MAT Input/Output (IO) Configuration, according to an illustrative implementation.

FIG. 3 depicts a single 2048×4096 or 8 Mb MAT IO Configuration, according to an illustrative implementation. Bit-line segments, such as 200a, 200b, 200c and 200d, may form the Memory block 100 as shown in FIG. 1. A total of 512 bit-line segments may make up the 2048WL×4096 BL Memory block 100. Each column select (CS) decoding line selects 64 bit-line segments (each with 8 bit-lines) within the 4096-BL MAT boundary. A total of 512 bits thus can be accessed. Although 512 bits may be stored in the SRAM page register, a subset of these bits may be accessed in sequence as part of a burst operation. For example, 64 bits from each BLSEG (e.g., one of 200a, 200b, 200c, 200d), may be accessed sequentially by the CS line. For example, a multiple CS may be turned on and operated simultaneously as part of a burst operation. Section 102 of the MAT IO Configuration 300 may correspond to the Unit MAT 102 of FIG. 1. Section 104 of the MAT IO Configuration 300 may correspond to the MUX block 104 of FIG. 1. Section 106 of the MAT IO Configuration 300 may correspond to the 512 Page Register SRAM 106 of FIG. 1. Section 108 of the MAT IO Configuration 300 may correspond to the 512 General-Purpose I/O (GIO) lines shown at 108 of FIG. 1. For a specific Address and IO configuration, a suitable memory block size can be designed to optimize the power, performance, and die area. Industry standard high density memory devices typically include of multiple banks of memory. Some have 8 banks while others have 16 or more banks.

Figure 4:
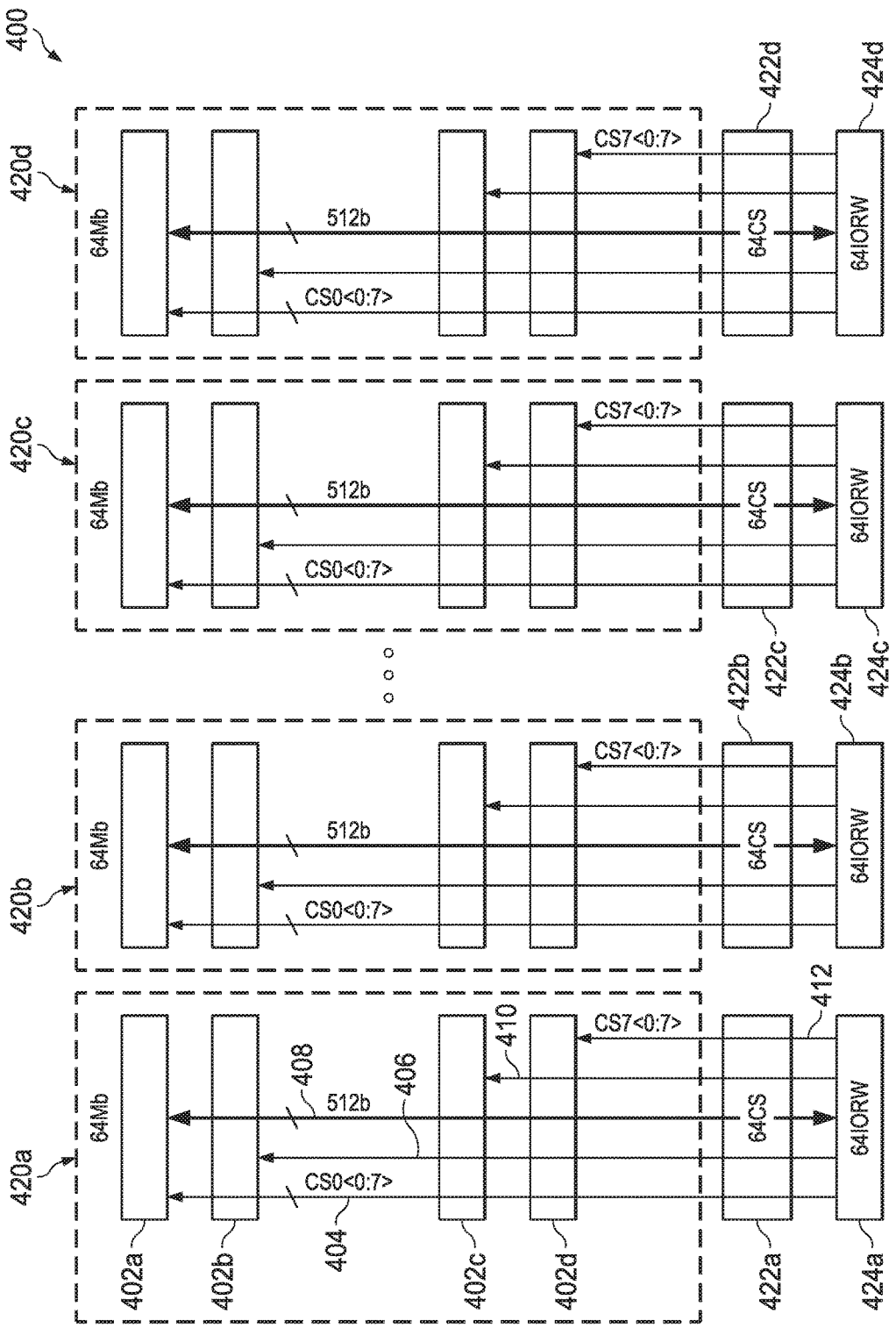
FIG. 4 depicts a block of 256 Mb Memory Bank with 2048 Global IO Bits, according to an illustrative implementation.

FIG. 4 depicts a block of 256 Mb Memory Bank with 2048 Global IO Bits, according to an illustrative implementation. Memory Bank 400 may be composed of four 64 Mb segments 420a, 420b, 420c and 420d (collectively 420). Each 64 Mb segment 420 may further include of eight 2048WL×4096BL (8 Mb) Memory blocks such as Memory block 402a, 402b, 402c and 402d (collectively 402) within segment 420a. Memory blocks 402a, 402b, 402c and 402d may be the Memory block 100 as shown in FIG. 1, and thus may each contain an associated SRAM Page Register 106 with 512 differential output pairs. The 512 SRAM differential output pairs in each Memory block 402 within each segment 420 of the Memory Bank 400 are connected to a corresponding differential GIO pair (GIO and GIOB) as shown at 214 of FIG. 2.

In the 64 Mb segments 420, each Memory block 402 is selected by a unique set of CS lines, such as CS lines 404, 406, 410 and 412 as shown in segment 420a. For example, CS0 <0:7> 404 selects the SRAMS in Memory block 402a, CS1 <0:7> 406 selects the SRAMS in Memory block 402b, CS 410 selects SRAMS in Memory block 402c, and CS7 <0:7> 412 selects the SRAMS in last Memory block 402d within segment 420a. There are total of 64 CS lines, such as CS lines 422a, 422b, 422c and 422d, 512 GIO lines, and 512 GIOB lines within the 64 Mb segments 420 as shown in Memory Bank 400; however, these values may be adjusted to optimize for product specifications. The number of CS lines may be adjusted to access the appropriate number of bits defined by the memory configuration of any of the examples described herein. Each Memory block (e.g., blocks 402a, 402b, 402c, 402d) retrieves and stores 512 bits, as shown at 408, in their respective SRAM page registers, such as Page Register 106. Multiple Memory blocks can be turned on at the same time to access more bits. For a page size of 16 kb, 32 MATs should be selected (512×32).

In all, 512 GIO-pairs can be multiplexed to 64 Data Read/Write (DRW) or 128 DRW lines (not shown) depending on the address configuration. For example, if 15 bits are used to address the row (32 k rows), then GIO bits from each 128 Mb (two 64 Mb segments) will be multiplexed to give a maximum IO width of 1024 bits. If 14 bits are used to address the row (16 k rows), then the maximum IO width can be 2048 bits. Many high density memory devices are configured with X8, X16, or X32 DQs. In the case of X16, the 16-n prefetch architecture requires a minimum data bus width of 256 lines (16×16). In FIG. 3, all 512 GIO differential pairs are multiplexed into 64 Read-Write circuits (IORW), such as Read-Write circuits 424a, 424b, 424c and 424d, which drive and receive data to and from the DRW lines (not shown). In some embodiments, a set of 64 BLSEGs (e.g., any of 200a, 200b, 200c, 200d) is selected from one of Memory blocks 402a, 402b, 402c, and 402d, as output to a respective read-write circuit (e.g., 424a) in a respective segment (e.g., 420a). The data on the DRW bus may be sent to the data re-ordering/parallel-to-serial circuits and to the output buffers (not shown). A total of 256 DRW lines can support a X16 DQ configuration.

Figure 5:
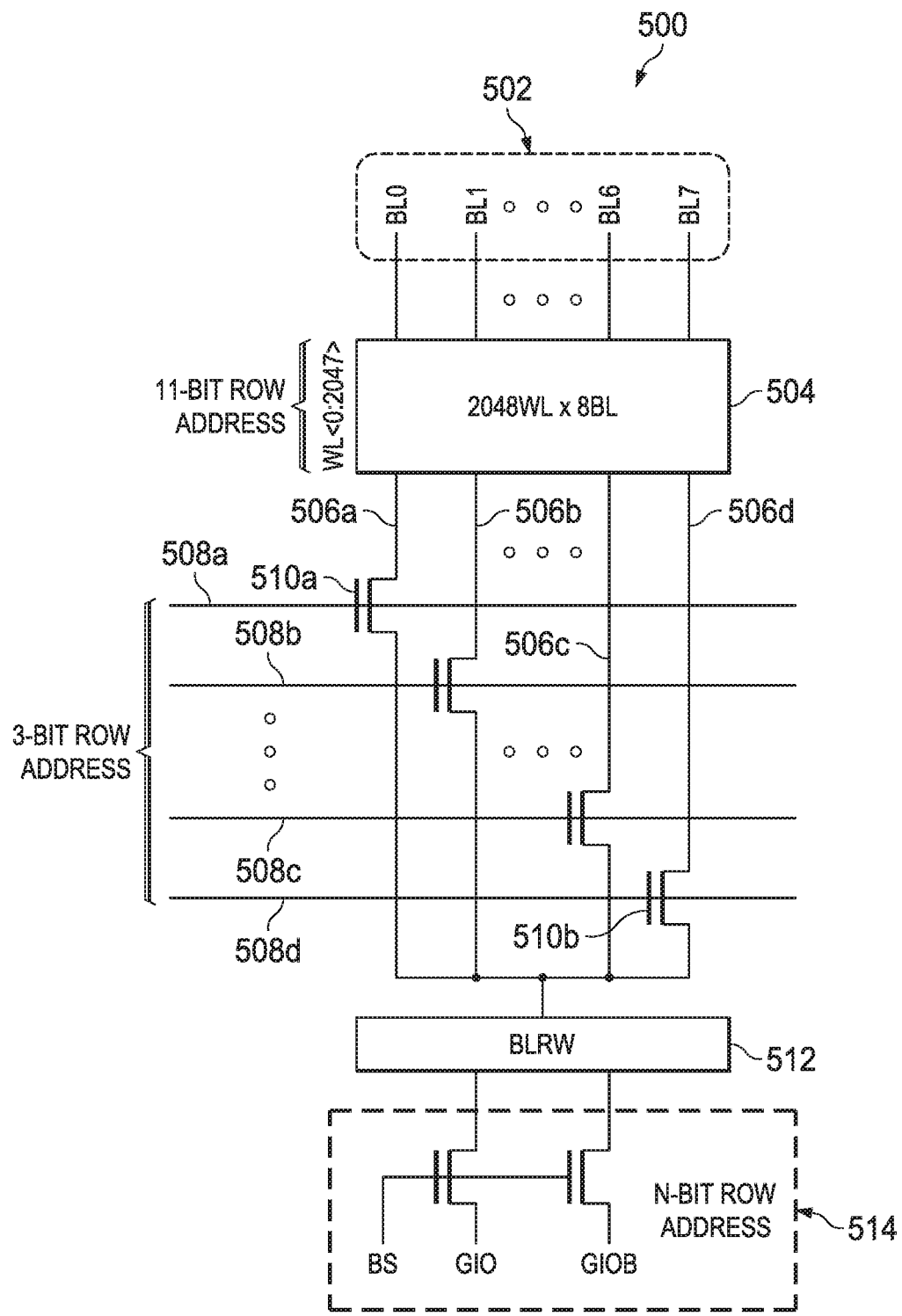
FIG. 5 depicts an alternative 8-1 BL MUX for use in memory arrays with a page register external to the bit-line segment, according to an illustrative implementation.

FIG. 5 depicts an alternative 8-1 BL MUX for use in memory arrays with a page register external to the bit-line segment, according to an illustrative implementation. In this case, the page registers are placed outside the entire memory array instead of being coupled locally within the MAT. The bit-line segment 500 includes a 2048-WL by 8-BL memory array 504, and BL columns 506a, 506b, 506c and 506d (collectively 506) each corresponding to one of the 8-BL of the memory array 504. MSL 508a, 508b, 508c and 508d (collectively 508) correspond to WLs, where the number of MSL 508 is the same number as the number of BL columns 506. Transistors, such as transistors 510a and 510b, are located along the diagonal of the BL column 506 and WL row 508 array such that each WL row 508 is coupled via a transistor to each of the BL columns 506. WL decoding and driver circuitry (not shown) may be any standard decoder and driver circuitry. Sensing and write circuitry (not shown) may be laid out within the 8-BL pitch formed by the BL columns 506 and MSL 508. This is an advantage as it allows the layout of the pitch cells (BL sense amplifiers, write drivers, etc.) to be relaxed as well as to occupy less space.

In some embodiments, three row address bits are used to select one of the MSL 508, and accordingly one of the BL columns 506. Since each of the BL columns 506 are coupled via a transistor (e.g., 510a, 510b) to each of the MSL 508, selecting a WL row 508 also selects a BL column 506. A selected BL column (e.g., one of columns 506) is stored externally to the bit-line segment 500, and may be output by BLRW512. The output of BL 512 through GIO pairs 514 may be stored in an external SRAM Page Register (not shown), such as the SRAM Page Register 214 in FIG. 2, or SRAM Page register 610 of FIG. 6, discussed further below. Thus, taking advantage of the DRAM address multiplexing scheme shown in the bit-line segment 500 allows BLs to be selected at Row time. This is significant since the memory cell can be addressed ahead of the Column address time. The data in the selected memory bits can be read and stored in the SRAM during a DRAM Bank Activation time, meaning that a slower Row time may be compensated for by the faster SRAM Page Register read time, allowing both rows 508 and columns 506 to be read within standard operating times. The row-to-column address delay is typically 15 ns to 18 ns, providing adequate time for BL sensing of the memory.

Figure 6:
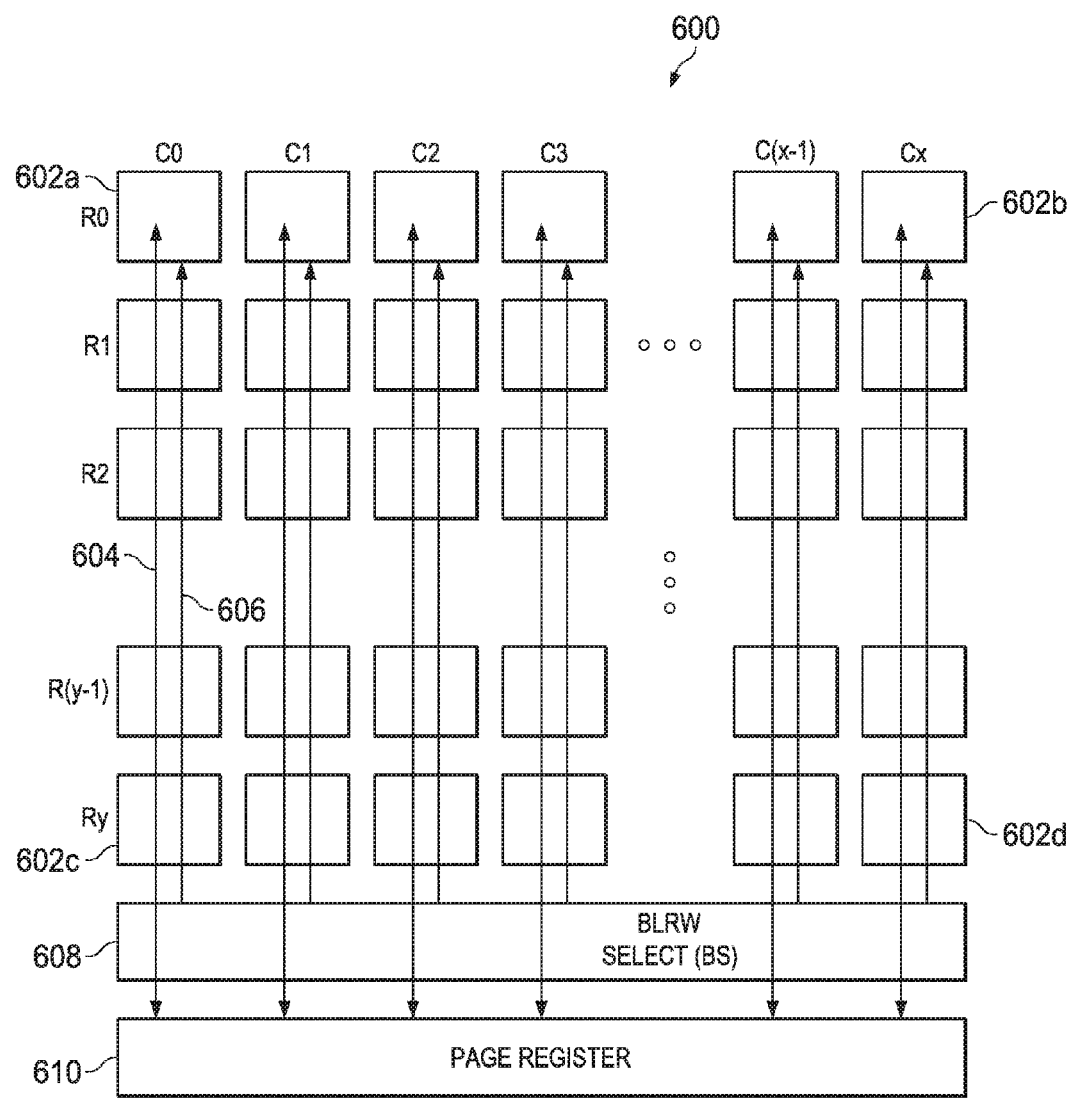
FIG. 6 depicts a block Memory Bank with a page register external to the MAT, according to an illustrative implementation.

FIG. 6 depicts a block Memory Bank with a page register external to the MAT, according to an illustrative implementation. The External Page Register Memory Bank 600 may be composed of Memory blocks, such as 602a, 602b, 602c and 602d (collectively 602). The number of Memory blocks 602, and the ratio of the dimension between Memory block 602a and 602b, and Memory block 602a and 602c, may be optimized to meet both space and timing product specifications. The BLRW circuits (not shown) are selected by row address bits that generate BLRW Select (BS) at 608, while the page registers continue to be selected by CS bits and are stored at the External Page Register 610 through Page Register lines such as 604. Page Register 610 may be an SRAM Page Register, DRAM Page Register, or any other register. The output of BLRW circuits may be coupled to a pass transistor (not shown) whose gate is connected to BS 608. Each Memory block 602 has a unique BS signal line, as shown, for example, at 606. Similar to the previous architecture, the GIO differential pair lines, such as GIO lines 108 as shown in FIG. 1, connect to all column Memory blocks 602, and are each selected by a unique BS decoding signal from BS608. The advantage of the architecture shown in the External Page Register Memory Bank 600 is that the Page Register 610 for each Memory block 602 is global instead of local, which saves area, but page size is limited by the physical arrangement of the Memory blocks 602. In FIG. 6, the BS 608 and External Page Register 610 are shown outside of the last row of Memory blocks 602; however, they may be located within the array of Memory blocks 602. The ratio of Memory blocks above and below the Page Register 610 within the array of Memory blocks 602 may be adjusted to optimize product speed and area specifications. In some embodiments, a ratio of an array size of each memory block (e.g., as measured as number of WLs and BLs in a cross-point memory array of the memory block, and/or a number of memory cells in the cross-point memory array) to an array size of an SRAM page register may vary. For example, the ratio may be 8 rows by 8 columns of (2048 WLs by 4096 BLs) (e.g., 512 M bits), to a 512-M bit SRAM page register (e.g., a 1:1 ratio). For example, the ratio may be a 2:1, 4:1, 8:1, 16:1, 32:1, 64:1 or higher ratio. As the ratio increases, there is a higher number of cross-point memory array cells to SRAM cells, and a smaller subset of the cross-point memory array cells are cached for fast access. However, as the ratio increases, efficiency of the memory bank (e.g., as measured by a percentage or fraction of device area consumed by cross-point memory array cells to a total area device area of the memory bank) increases as well.

This description has been presented for the purposes of illustration. It is not intended to be exhaustive or to limit the invention to the precise form described, and many modifications and variations are possible in light of the teaching above. The figures are not drawn to scale and are for illustrative purposes. The embodiments were chosen and described in order to best explain the principles of the invention and its practical applications. This description will enable others skilled in the art to best utilize and practice the invention in various embodiments and with various modifications as are suited to a particular use. The scope of the invention is defined by the following claims.

What is claimed is:

1. An apparatus comprising:
 a memory array tile comprising a cross-point memory array having a plurality of word-lines, a plurality of bit-lines, and a plurality of memory cells at one or more intersections of the plurality of word-lines and the plurality of bit-lines;
 a decoder comprising a first plurality of inputs corresponding to a first portion of a row address, and a first plurality of outputs coupled to at least a portion of the plurality of word-lines;
 a multiplexor comprising a second plurality of inputs corresponding to a second portion of the row address, a third plurality of inputs coupled to at least a portion of the plurality of bit-lines, and at least one multiplexor output; and
 at least one memory device coupled to the at least one multiplexor output, the at least one memory device comprising an input based on at least a portion of a column address, and wherein a read access time of the at least one memory device is shorter than a read access time of a memory cell of the cross-point memory array.

2. The apparatus of claim 1, wherein the at least one memory device is a register.

3. The apparatus of claim 1, wherein the memory array tile comprises a plurality of bit-line segments, and wherein each of the plurality of bit-line segments is coupled to another bit-line segment by the plurality of word-lines, and
 wherein each of the plurality of bit-line segments comprises:
  a respective subset of the plurality of bit-lines;
  a respective multiplexor comprising a respective second plurality of inputs corresponding to the second portion of the row address, a respective second plurality of outputs coupled to the respective subset of the plurality of bit-lines, and at least one respective output; and
  at least one respective memory device coupled to the at least one respective multiplexor output; and
 wherein a first bit-line segment of the plurality of bit-line segments comprises:
  the at least a portion of the plurality of bit-lines;
  the multiplexor comprising the second plurality of inputs corresponding to the second portion of the row address, the second plurality of inputs coupled to the at least a portion of the plurality of bit-lines, and the at least one multiplexor output;
  the at least one memory device coupled to the at least one multiplexor output, the at least one memory device comprising the input based on the at least a portion of the column address.

4. The apparatus of claim 3, wherein each respective multiplexor of each bit-line segment multiplexes at least eight inputs to an output.

5. The apparatus of claim 1, wherein a ratio of a number of the plurality of bit-lines to a number of the plurality of word-lines is greater than a multiple of two.

6. The apparatus of claim 1, wherein a percentage of a total area of the apparatus that is occupied by the plurality of memory cells exceeds 70%.

7. The apparatus of claim 1, wherein each of the plurality of memory cells is a thyristor memory cell.

8. An apparatus comprising:
 a memory array tile comprising a cross-point memory array having a plurality of word-lines, a plurality of bit-lines, and a plurality of memory cells at one or more intersections of the plurality of word-lines and the plurality of bit-lines;
 a decoder configured to receive a first portion of a row address and select a word-line of the plurality of word-lines based on receiving the first portion of the row address;

a multiplexor configured to receive a second portion of the row address and select at least one bit-line of the plurality of bit-lines as at least one multiplexor output; and at least one memory device coupled to the at least one multiplexor output, configured to receive an input based on at least a portion of a column address.

9. The apparatus of claim 8, wherein the at least one memory device is a register.

10. The apparatus of claim 8, wherein the memory array tile comprises a plurality of bit-line segments, and wherein each of the plurality of bit-line segments is coupled to another bit-line segment by the plurality of word-lines, and wherein each of the plurality of bit-line segments comprises:
 a respective subset of the plurality of bit-lines;
 a respective multiplexor configured to receive the second portion of the row address and select at least one bit-line of the respective subset of the plurality of bit-lines as at least one respective multiplexor output; and
 at least one respective memory device coupled to the at least one respective multiplexor output, configured to receive the input based on the at least a portion of the column address; and wherein a first bit-line segment of the plurality of bit-line segments comprises:
 the at least a portion of the plurality of bit-lines;
 the multiplexor configured to receive the second portion of the row address;
 the at least one memory device coupled to the at least one multiplexor output.

11. The apparatus of claim 10, wherein each respective multiplexor of each bit-line segment multiplexes at least eight inputs to an output.

12. The apparatus of claim 8, wherein a ratio of a number of the plurality of bit-lines to a number of the plurality of word-lines is greater than a multiple of 2.

13. The apparatus of claim 8, wherein each of the plurality of memory cells is a thyristor memory cell.

14. A memory bank comprising:
 a plurality of memory blocks divided into a plurality of rows of memory blocks and a plurality of columns of memory blocks, wherein each respective column comprises a respective first plurality of input lines that is coupled to each memory block of the respective column and a respective first plurality of output lines that is coupled to each memory block of the respective column;
 a select device coupled to each column of memory blocks by a respective second plurality of input lines corresponding to a respective column, wherein the select device is configured to receive a first input based on at least a portion of a row address and configured to generate signals, based on receiving the first input, for accessing at least one memory block of the plurality of memory blocks; and
 a memory device coupled to each column of memory blocks by a respective second plurality of output lines corresponding to a respective column, wherein a read access time of the memory device is shorter than a read access time of a memory cell of a cross-point memory array and wherein the memory device is configured to:
  receive a second input based on at least a portion of a column address, and
  store data from the accessed at least one memory block, based on receiving the second input.

15. The memory bank of claim 14, wherein the memory device is an SRAM memory device.

16. The memory bank of claim 14, wherein each memory block of the plurality of memory blocks further comprises:
 a memory array tile comprising a cross-point memory array having a plurality of word-lines, a plurality of bit-lines, and a plurality of memory cells at one or more intersections of the plurality of word-lines and the plurality of bit-lines;
 a decoder comprising a third plurality of inputs corresponding to a first portion of the row address, and a third plurality of outputs coupled to at least a portion of the plurality of word-lines; and
 a multiplexor comprising a fourth plurality of inputs corresponding to a second portion of the row address, and a fifth plurality of inputs coupled to at least a portion of the plurality of bit-lines, and at least one multiplexor output.

17. The memory bank of claim 16, wherein each memory block of the plurality of memory blocks does not include an SRAM memory device.

18. The memory bank of claim 16, wherein each memory cell of the plurality of memory cells of the memory array tile is a thyristor memory cell.

19. The memory bank of claim 16, wherein a percentage of total area of each memory block that is occupied by a respective plurality of memory cells exceeds 70%.

* * * * *